(12) United States Patent
Hashiguchi et al.

(10) Patent No.: US 7,763,931 B2
(45) Date of Patent: Jul. 27, 2010

(54) NONVOLATILE SEMICONDUCTOR MEMORY DEVICE AND METHOD OF MANUFACTURING THE SAME

(75) Inventors: Tomoharu Hashiguchi, Mie (JP); Hajime Nagano, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 11/965,297

(22) Filed: Dec. 27, 2007

(65) Prior Publication Data

US 2008/0211006 A1 Sep. 4, 2008

(30) Foreign Application Priority Data

Dec. 28, 2006 (JP) .............................. 2006-355995

(51) Int. Cl.
*H01L 29/788* (2006.01)

(52) U.S. Cl. .................. 257/315; 257/239; 257/261; 257/320; 257/323; 257/E29.069; 438/791

(58) Field of Classification Search ................ 257/239, 257/261, 315, 316, 317, 318, 319, 320, 321, 257/322, 323, E21.69; 438/791
See application file for complete search history.

(56) References Cited

U.S. PATENT DOCUMENTS

| | | | |
|---|---|---|---|
| 6,100,579 A | 8/2000 | Sonoda et al. | |
| 6,720,612 B2 * | 4/2004 | Takeuchi et al. | ............ 257/315 |
| 6,828,624 B1 | 12/2004 | Goda et al. | |
| 6,894,341 B2 | 5/2005 | Sugimae et al. | |
| 7,309,891 B2 | 12/2007 | Yaegashi et al. | |
| 2003/0111695 A1 * | 6/2003 | Kanamori | ................... 257/384 |
| 2003/0232514 A1 * | 12/2003 | Kim et al. | ................... 438/791 |

FOREIGN PATENT DOCUMENTS

| | | |
|---|---|---|
| JP | 9-289209 | 11/1997 |
| JP | 11-126833 | 5/1999 |
| JP | 2000-311992 | 11/2000 |
| JP | 2003-297956 | 10/2003 |

* cited by examiner

*Primary Examiner*—Fernando L Toledo
(74) *Attorney, Agent, or Firm*—Oblon, Spivak, McClelland, Maier & Neustadt, L.L.P.

(57) ABSTRACT

A nonvolatile semiconductor memory including a semiconductor substrate having an upper surface; a plurality of memory cell transistors formed in the semiconductor substrate, each memory cell transistor including a gate electrode having a gate insulating layer on the upper surface of the semiconductor substrate, a floating gate electrode layer on the gate insulating layer, an inter-gate insulating layer on the floating gate electrode layer, and a control gate electrode layer on the inter-gate insulating layer; a first oxide-based insulating film formed above the upper surface of the semiconductor substrate between the gate electrodes, and including an upper surface as high or higher than that of the floating gate electrode layer but lower than that of the control gate electrode layer; a nitride-based insulating film containing boron formed on the first oxide-based insulating film and the control gate layer; and a second oxide-based insulating film formed on the nitride-based insulating film.

7 Claims, 8 Drawing Sheets

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2006-355995, filed on, Dec. 28, 2006 the entire contents of which are incorporated herein by reference.

FIELD

The present disclosure is directed to a nonvolatile semiconductor memory device provided with a floating gate electrode and a method of manufacturing the same.

BACKGROUND

A typical nonvolatile semiconductor memory device such as a NAND flash memory is increasing its application to multimedia cards by its capability to retain information without power supply. Recent demands for larger storage capacity calls for further integration of memory cell transistors. The problem inherent in integration is the increase in the so called Yupin effect. Narrower spacing between the neighboring memory cell transistors leads to increase in parasitic capacitance between the gate electrodes, whereby the transistors are increasingly affected by the write operation performed on the neighboring cells. Erroneous write operations occur more frequently under such conditions.

An insulating film is generally filled between the gate electrode gaps in order to insulate the neighboring gate electrodes. In case only a silicon oxide film is employed as the insulating film for gap fill purposes, unintended oxidizing reaction may occur at the gate electrode by foreign moisture permeating the silicon oxide film during thermal treatment. This may alter the structure of the gate electrode, resulting in failure in obtaining the desired electrical properties. Silicon nitride film is known for effectively preventing moisture permeation. One example of employing silicon nitride film for such purpose is disclosed in JP 2003-297956 A, for example. The use of silicon nitride film poses negative impact on device operation since the silicon nitride film, having higher dielectric constant than silicon oxide film, causes increase in parasitic capacitance as the gaps between the cells become narrower due to device integration.

SUMMARY

The present disclosure provides a nonvolatile semiconductor memory device that prevents external moisture permeation while suppressing negative impact of parasitic capacitance increase. The present disclosure also provides a method of manufacturing such device.

A nonvolatile semiconductor memory device of the present disclosure includes a semiconductor substrate including an upper surface; a plurality of memory cell transistors formed in the semiconductor substrate, each memory cell transistor including a gate electrode having a gate insulating layer formed on the upper surface of the semiconductor substrate, a floating gate electrode layer formed on the gate insulating layer, an inter-gate insulating layer formed on the floating gate electrode layer, and a control gate electrode layer formed on the inter-gate insulating layer; a first oxide-based insulating film formed above the upper surface of the semiconductor substrate between the gate electrodes, the first oxide-based insulating film including an upper surface being at level with or higher than an upper surface of the floating gate electrode layer; a nitride film formed on the first oxide-based insulating film in a thickness equal to a thickness of the inter-gate insulating film; and a second oxide-based insulating film formed on the nitride film so as to cover the control gate electrode layer.

A method of manufacturing a nonvolatile semiconductor device of the present disclosure includes forming a plurality of gate electrodes on a semiconductor substrate, each gate electrode including a gate insulating layer formed on the semiconductor substrate, a floating gate electrode layer formed on the gate insulating layer, an inter-gate insulating layer formed on the floating gate electrode layer and a control gate electrode layer formed on the inter-gate insulating layer; forming a first oxide-based insulating film above the semiconductor substrate between the gate electrodes, the first oxide-based insulating film being formed at level with or higher than the floating gate electrode layer but lower than an upper surface of the control gate electrode layer; forming a nitride-based insulating film on the first oxide-based insulating film, the nitride-based insulating film containing boron (B); and forming a second oxide-based insulating film on the nitride-based insulating film so as to cover the control gate electrode layer.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment employing the present disclosure to a NAND flash memory will be described with reference to FIGS. 1 to 8. References are made to the drawings hereinafter with identical or similar reference symbols when referring to identical or similar elements. Of note is that the drawings are merely schematic and the relation between the thickness and the planar dimensions and the ratio in thickness of each layer differs from the actual ratio.

First, a description will be given on the configuration of the NAND flash memory of the present embodiment.

Figure 1:
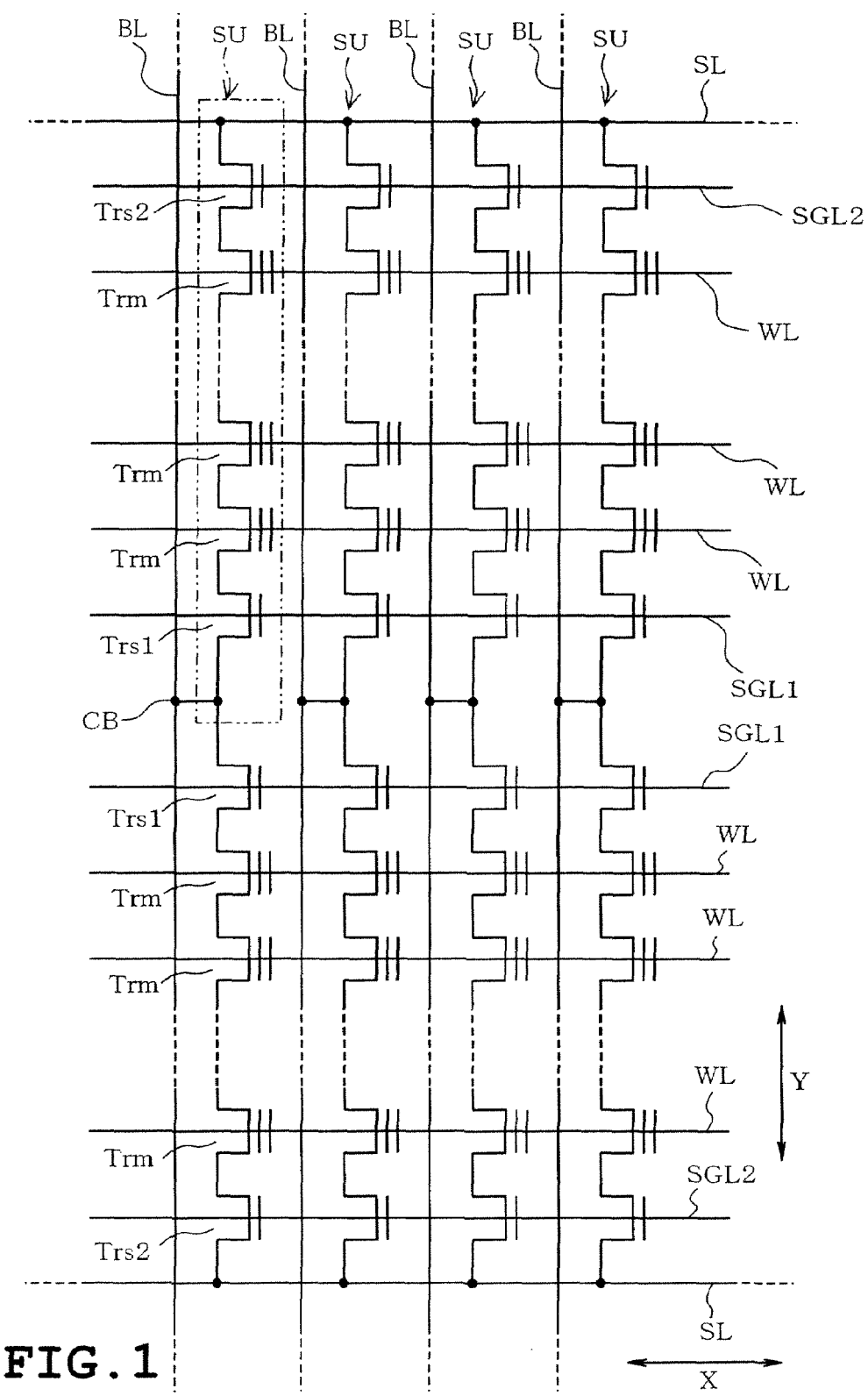
FIG. 1 is an equivalent circuit representing a portion of a memory cell array of a NAND flash memory indicating a first embodiment of the present disclosure.

FIG. 1 illustrates an equivalent circuit representing a portion of a memory cell array formed in the memory cell region of the NAND flash memory.

The memory cell array of the NAND flash memory is configured by a matrix of NAND cell units SU. The NAND cell unit SU is constituted by two select gate transistors Trs1, Trs2, and a plurality (eight for example: nth power of 2 (n is a positive integer)) of memory cell transistors Trm connected in series to the two select gate transistors Trs1 and Trs2. The plurality of neighboring memory cell transistors Trm shares source/drain regions within a single NAND cell unit SU.

Referring to FIG. 1, the memory cell transistors Trm aligned in an X-direction (corresponding to word line direction and gate width direction) are coupled to a common word line (control gate line) WL. Also, the select gate transistors Trs1 aligned in the X-direction in FIG. 1 are coupled to a common select gate line SGL1. The select gate transistors Trs2 are coupled to a common select gate line SGL2. A bit line contact CB is coupled to a drain region of the select gate transistor Trs1. The bit line contact CB is coupled to a bit line BL extending in the Y-direction (corresponding to the gate length direction and the bit line direction) perpendicularly crossing the X-direction indicated in FIG. 1. The select gate transistor Trs2 is connected to a source line SL extending in the X direction of FIG. 1 via the source region.

Figure 2:
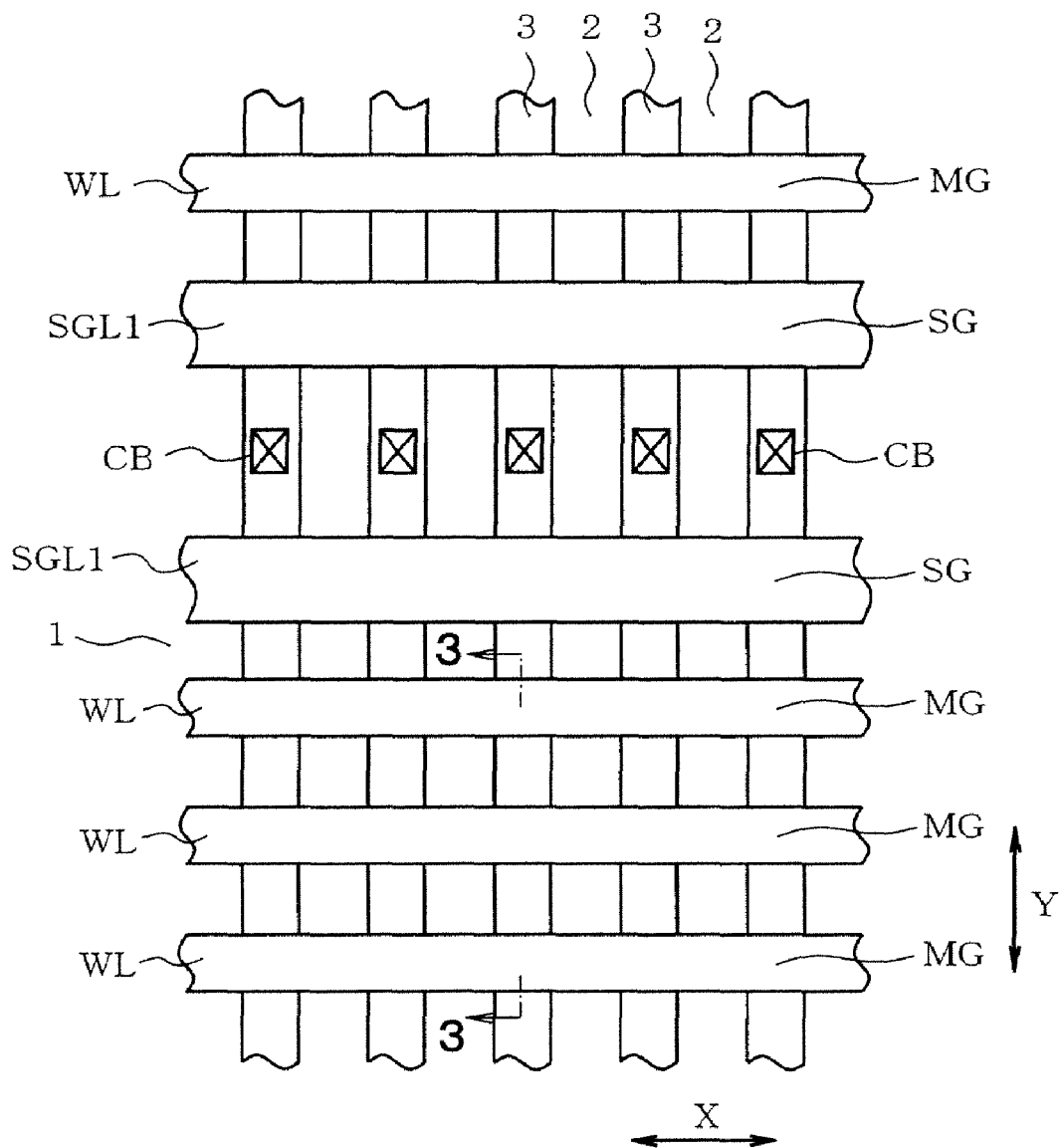
FIG. 2 is a schematic plan view indicating a partial layout of a memory cell region.

FIG. 2 is a plan view indicating a layout of a portion of the memory cell. A plurality of STIs 2 (shallow trench isolation) serving as an element isolation region is formed at predetermined intervals along the Y-direction as viewed in FIG. 2 to form active regions 3 in the X-direction as viewed in FIG. 2. Word lines WL of memory cell transistors are formed at predetermined intervals along the X-direction as viewed in FIG. 2 perpendicular to the active region 3.

Also, a pair of select gate lines SGL1 for a pair of select gate transistors is formed along the X-direction as viewed in FIG. 2. Bit line contacts CB are formed in the active region 3 between the pair of select gate lines SGL1. A gate electrode MG of the memory cell transistor is formed at the crossover of the active region 3 and the word line WL, and a gate electrode SG is formed at the crossover of the active region 3 and the select gate line SGL 1. Each NAND cell unit SU may be configured to include a plurality of (nth power of 2 (n is a positive integer))

Figure 3:
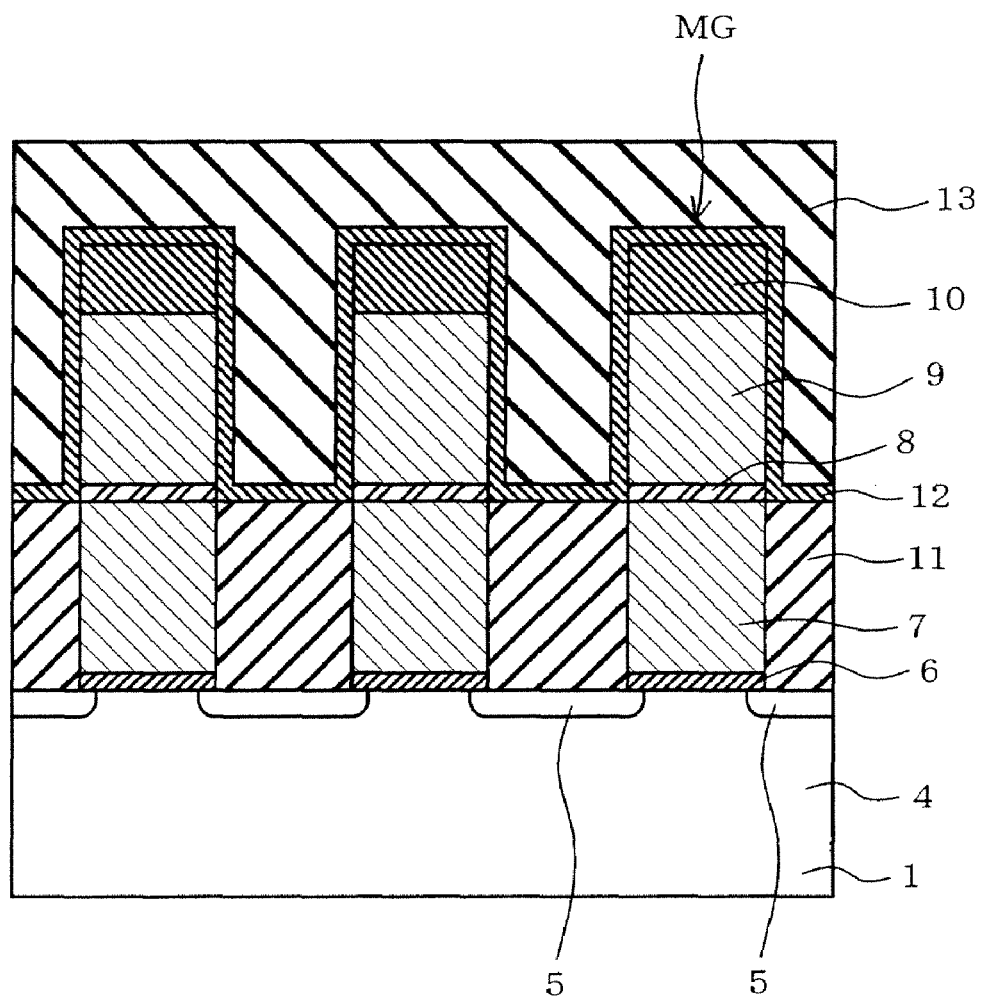
FIG. 3 is a cross sectional view taken along line 3-3 of FIG. 2.

FIG. 3 is a cross sectional view taken along the bit line direction (Y direction) indicated by line 3-3 of FIG. 2, illustrating the memory cell array of the active region 3 of the present embodiment. As can be seen in FIG. 3, the memory cell transistor of the NAND cell unit SU is formed in a well 4 provided in the silicon substrate 1 and is connected in the bit line direction via the diffusion layer 5 formed in the semiconductor substrate 1. FIG. 3 illustrates one phase of the ongoing manufacturing steps which will be subject to further processing.

The memory cell transistor includes the diffusion layer 5 corresponding to the source/drain region formed in the silicon substrate 1, a gate insulating film 6 formed on the silicon substrate 1, and the gate electrode MG provided on the gate insulating film 6. The gate electrode MG includes a floating gate electrode film 7 constituting a charge storing layer, an inter-gate insulating film 8 formed on the floating gate electrode film 7, and a control gate electrode film 9 formed on the inter-gate insulating film 8. At this stage, a hard mask material 10 is formed on the upper portion of the gate electrode film 9.

The floating gate electrode film 7 and the control gate electrode film 9 are composed of polycrystalline silicon films and the inter-gate insulating film 8 is formed by insulating films having high-dielectric constant such as an ONO (oxide-nitride-oxide) film or NONON (nitride-oxide-nitride-oxide-nitride) film. The control gate electrode film 9 establishes connection with the memory cell transistors in other NAND cell units SU situated adjacently in the direction normal to FIG. 3 and functions as a word line WL.

A silicon oxide film 11 constituting a first oxide-based insulating film is formed on the silicon substrate 1 situated in the gaps between the gate electrodes MG of the memory cell transistors. The silicon oxide film 1 fills the gaps so as to be as high as the boundary between the floating gate electrode film 7 and the inter-gate insulating film 8. A silicon nitride film (SiBN) 12 of a predetermined thickness is formed on the upper surface of the silicon oxide film 11 and on the exposed sidewalls and the upper surface of the gate electrode MG. The silicon nitride film 12 serves as a nitride-based insulating film and contains boron (B). The silicon nitride film 12 functions as a barrier film to prevent moisture permeation. The configuration described in the present embodiment forms the silicon oxide film 11 directly on the upper surface of the silicon substrate 1. However, the silicon oxide film 11 may be formed on the silicon substrate 1 via the gate insulating film 6 left remaining on the silicon substrate.

The silicon nitride film 12 is configured at a thickness equal to or greater than the inter-gate insulating film 8, for example, and the underside of the silicon nitride film 12 does not extend over the sidewall of the floating gate electrode film 7. Boron (B) is introduced in the silicon nitride film 12 to reduce relative dielectric constant compared to an ordinary silicon nitride film. The relative dielectric constant of an ordinary silicon nitride film is 7.9, and the relative dielectric constant of boron-containing silicon nitride film 12 is controlled in the range of 4 to 5.

A silicon oxide film 13 constituting a second oxide-based insulating film is formed to fully cover the upper surface of the silicon nitride film 12. More specifically, the silicon oxide film 13 covers the upper surface of silicon nitride film 12 overlying the gate electrode MG and the upper surface of the silicon nitride film 12 overlying the gaps between the gate electrode MG so as to fill the gaps.

The above configuration prevents external moisture from permeating the floating gate electrode film 7 by utilizing the silicon nitride film 12. Further, the relative dielectric constant of the silicon nitride film 12 can be reduced to about 4 to 5 by introduction of boron to suppress the parasitic capacitance at the gate electrode MG gaps.

Then, the upper portion of the control gate electrode film 9 is silicided and processed into a low resistance layer such as cobalt silicide ($CoSi_2$). Further, the upper interconnect layer and interlayer insulating film are formed to complete manufacturing of the NAND flash memory.

FIG. 3 illustrates the silicon oxide film 11 being formed directly on the silicon substrate 1. However, the diffusion layer 5 may be formed without removing the gate insulating film 6 so as to form the silicon oxide film 11 on the silicon substrate 1 via the gate insulating film 6.

Next, one example of manufacturing steps of the NAND flash memory in accordance with the present embodiment will be described with reference to cross sectional views taken along the bit line direction as shown in FIGS. 4 to 7.

Figure 4:
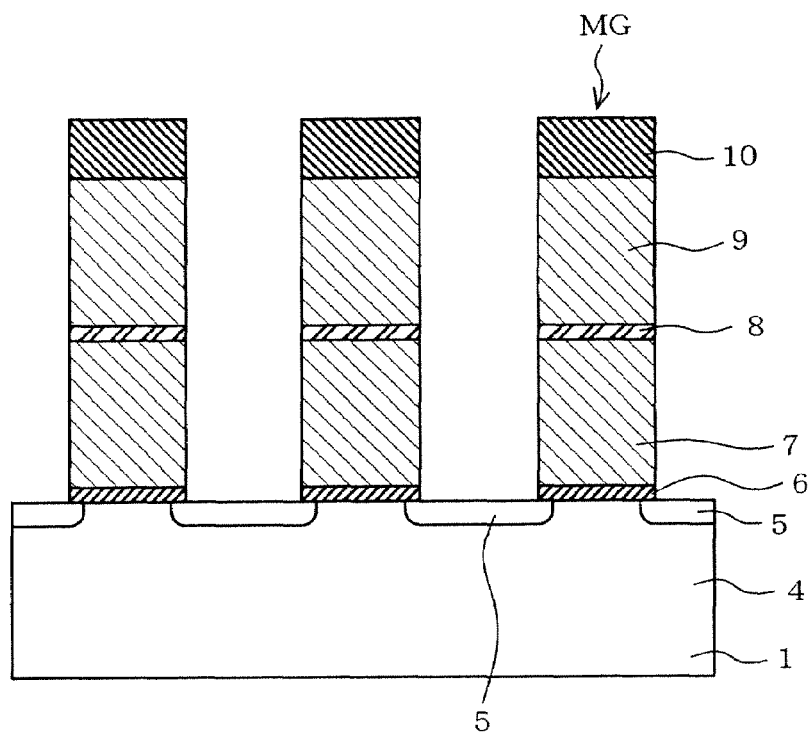
FIG. 4 is a schematic cross sectional view showing one phase of a manufacturing step.

FIG. 4 illustrates the gate electrode MG formed on the silicon substrate 1 having the well 4 and the STI 2 formed thereto. In this step, first, the well 4 and the STI 2 providing element isolation are formed in the silicon substrate 1. Then, the gate insulating film 6 and the polycrystalline silicon film constituting the floating gate electrode film 7 are deposited entirely over the active region 3 of the silicon substrate 1 isolated by the STI 2. Thereafter, the films undergo lithography and etch process to be processed into elongate strips extending in the bit line direction. Subsequently, the inter-gate insulating film 8, the polycrystalline silicon film constituting the control gate electrode film 9 and a hard mask material 10 are formed further on top.

The gate insulating film 6 functions as a tunnel oxide film of the memory cell transistor and is composed of a silicon oxide film ($SiO_2$) in a thickness of approximately 8 nm, for example. The polycrystalline silicon film is processed into the floating gate electrode film 7 and the control gate electrode film 9. The polycrystalline silicon films are heavily doped with phosphorous (P) or boron (B). The inter-gate insulating film 8 comprises an ONO film composed of laminated layers of silicon oxide film ($SiO_2$ film)/silicon nitride film ($Si_3N_4$ film)/silicon oxide film ($SiO_2$ film), for instance, each layer being configured at a thickness of 3 nm to 10 nm, for example. The hard mask material 10 is used as an etch mask when patterning the gate electrode MG and is composed of silicon nitride film ($Si_3N_4$ film), for example.

The laminated layers are patterned into the form of the gate electrode MG by lithography process. More specifically, the hard mask material 10 is processed into the pattern of the gate electrode MG by lithography and etch process. Then, etch process is performed using the patterned hard mask material 10 as a mask to form the control gate electrode film 9, the inter-gate insulating film 8, the floating gate electrode film 7 constituting the gate electrode MG. The etch process exposes the surface of the silicon substrate 1 situated between the gate electrodes MG.

Further, post-oxidation is performed to recover the damages suffered by the etch process executed during gate electrode processing. Then, the diffusion layer 5 is formed in the silicon substrate 1 surface situated between the gate electrodes MG by doping impurities by ion implantation using the gate electrode MG as a mask. N-type arsenic (As) or phosphorous (P), for example, may be employed as doped impurities. However, in case the well 4 is of an n-type, p-type impurities such as boron (B) or difluoroboron ($BF_2$) may be used instead.

The select gate transistor and the memory cell transistor within the memory cell array are electrically connected via the diffusion layer 5. Ion implantation for forming the diffusion layer 5 is performed before or after post oxidation as described above.

Figure 5:
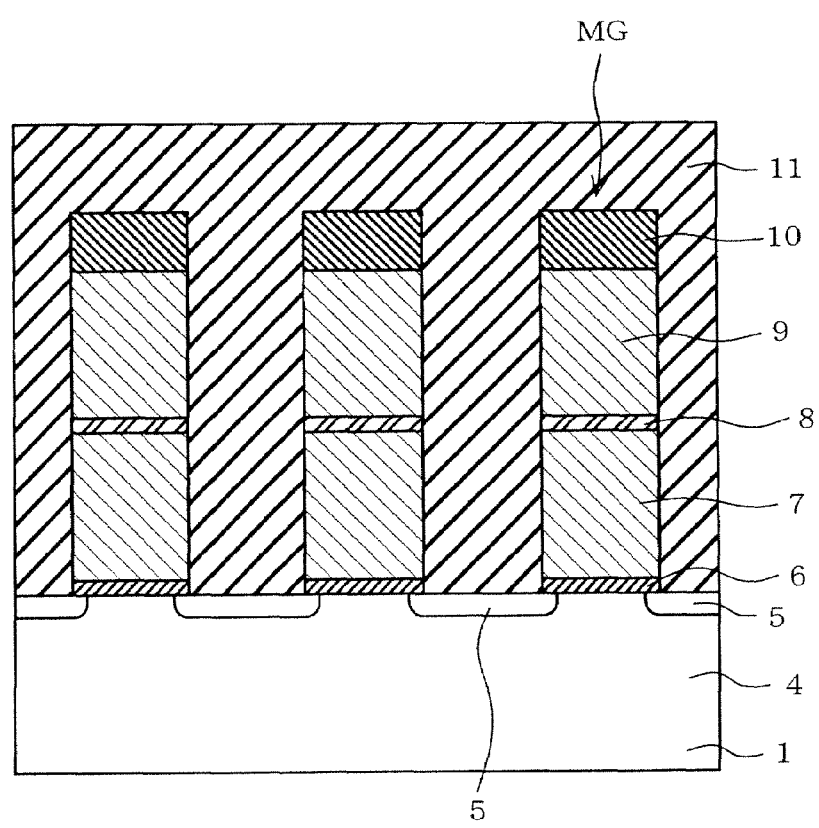
FIG. 5 is a schematic cross sectional view showing one phase of a manufacturing step ($2^{nd}$ variation)

Next, referring to FIG. 5, the silicon oxide film 11 constituting the first oxide-based insulating film is formed between the gate electrodes MG of the memory cell transistors. In this step, first, the silicon oxide film 11 is deposited entirely over the underlying structure. The thickness of the silicon oxide film 11 is configured at a thickness such to fully fill the gate electrode MG gaps of the memory cell transistors and to cover the upper portion of the gate electrode MG, for example. The silicon oxide film 11 is composed of a TEOS(tetraethyl orthosilicate)-$SiO_2$ film and is formed in the temperature range of 600 to 800 degrees Celsius using gases such as dichlorosilane ($SiH_2Cl_2$) gas, nitrogen monoxide ($N_2O$) gas or TEOS gas. In this case, different types of silicon oxide films may be deposited a plurality of times instead of the silicon oxide film 11.

Figure 6:
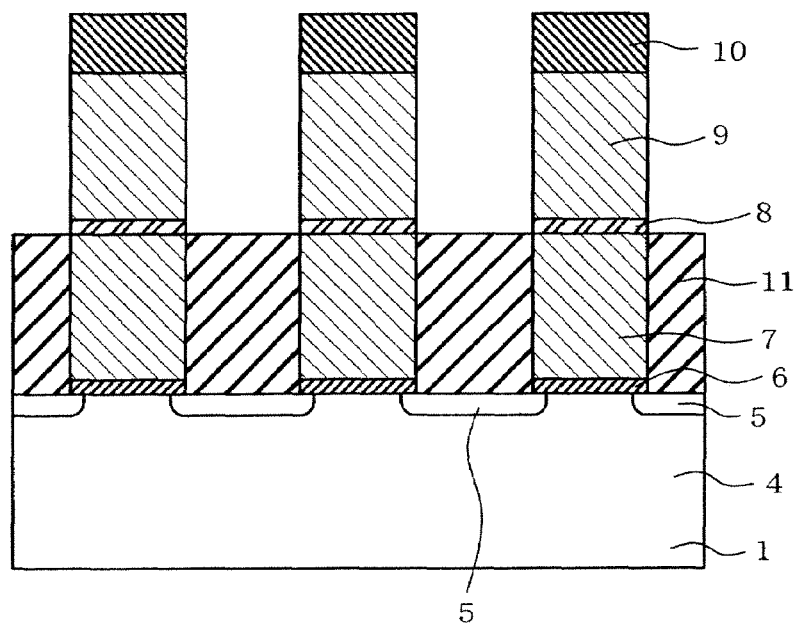
FIG. 6 is a schematic cross sectional view showing one phase of a manufacturing step ($3^{rd}$ variation)

Next, referring to FIG. 6, the silicon oxide film 11 is etched back. In this step, the silicon oxide film 11 may be removed by anisotropically etching the entire surface of the silicon oxide film 11 without lithography process. The etch depth is controlled so that the height of the silicon oxide film 11 from the silicon substrate 1 surface is equal to or higher than the height of the upper surface of the floating gate electrode film 7. FIG. 6 shows the silicon oxide film 11 having a height equal to the height of the upper surface of the floating gate electrode film 7, under which state the side surfaces of the inter-gate insulating films 8 are exposed.

Figure 7:
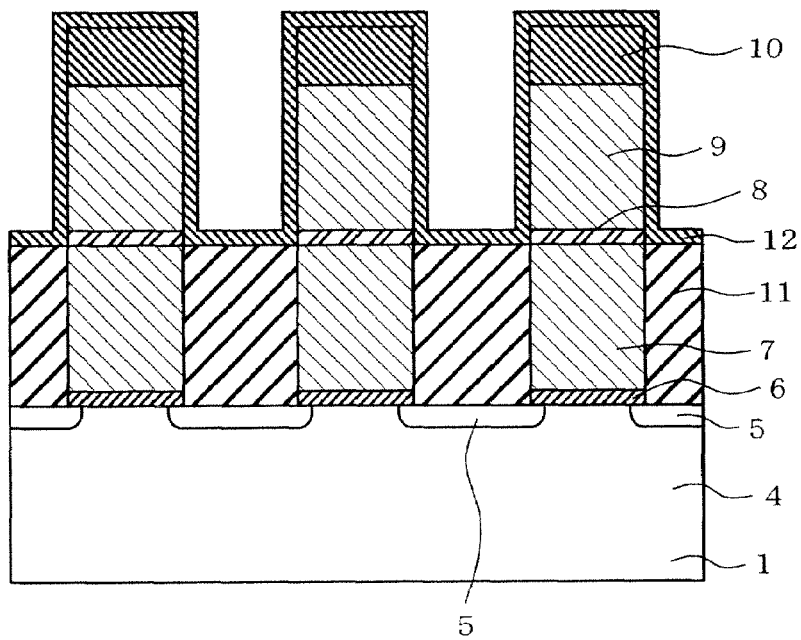
FIG. 7 is a schematic cross sectional view showing one phase of a manufacturing step ($4^{th}$ variation)

Next, referring to FIG. 7, the silicon nitride film 12 containing boron is formed. In this step, the silicon nitride film 12 is formed on the silicon oxide film 11 so as to cover the exposed gate electrode MG. The silicon nitride film 12 is formed in the temperature range of 400 to 600 degrees Celsius using source gases such as hexachlorodisilane ($Si_2Cl_6$) gas, ammonia ($NH_3$) gas, and trichloroboron ($BCl_3$) gas. The silicon nitride film formed by such temperature range and gases has lower dielectric constant compared to the silicon nitride film formed by source gases $SiH_2Cl_2$ and $NH_3$ in the temperature range of 700 to 800 degrees Celsius.

More specifically, the relative dielectric constant of the silicon nitride film 12 of the present embodiment can be controlled within the range of about 4 to 7 by adjustment of temperature and boron (B) dose. Thus, increase in parasitic capacitance between the cells can be suppressed compared to the conventional silicon nitride film. It has been verified by the inventors that the amount of boron contained (atomic %) and the relative dielectric constant exhibit a correlation depicted in FIG. 8.

Next, the silicon oxide film 13 constituting the second oxide-based insulating film is formed. In this step, the silicon oxide film 13 is formed entirely over the upper surface of the silicon nitride film 12 as illustrated in FIG. 3. The silicon oxide film 13 is formed under the same conditions as the silicon oxide film 11. The silicon oxide film 13 is filled between the gate electrodes MG while also being formed on the upper surface of the gate electrode MG.

The above described steps achieve the state illustrated in FIG. 3. Further steps such as silicidation of the upper portion of the control gate electrode film 9, interlayer insulating film formation, contact hole and via hole formation, and patterning of metal interconnect are performed to complete manufacturing of NAND flash memory.

According to the present embodiment, the silicon nitride film 12 for preventing moisture permeation is formed to be substantially equal to the height of the inter-gate insulating film 8 between the gate electrodes MG and formed so as not to be in contact with the floating gate electrode film 7. Thus, increase in parasitic capacitance between the neighboring memory transistors can be suppressed.

Also, boron (B) is introduced in the silicon nitride film 12, allowing reduction in relative dielectric constant compared to silicon nitride films without boron, thereby suppressing increase in parasitic capacitance. Thus, increase in parasitic capacitance can be suppressed even if the silicon oxide film 11 remains on the side surface of the control gate electrode film 9 due to variation in etch amount in the silicon oxide film 11 etch back.

Figure 9:
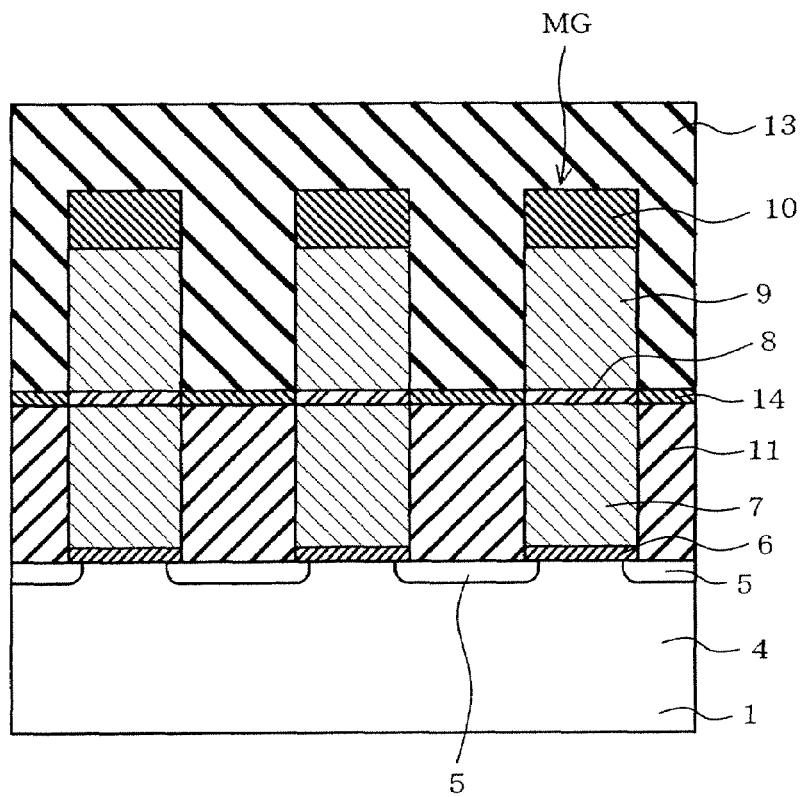
FIG. 9 indicates a second embodiment of the present disclosure and corresponds to FIG. 3.
Figure 10:
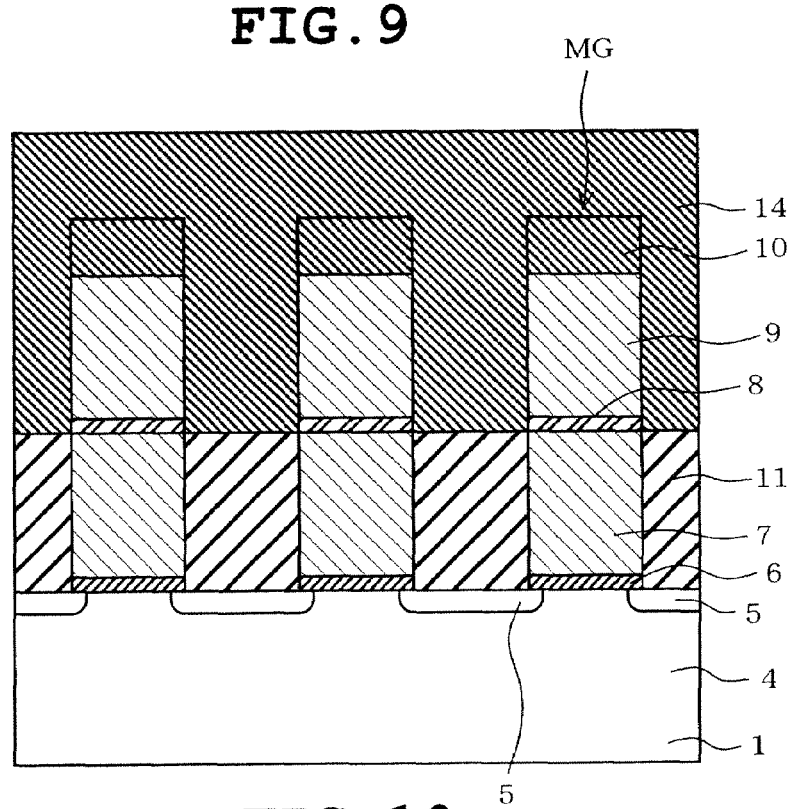
FIG. 10 is a schematic cross sectional view showing one phase of a manufacturing step.
Figure 11:
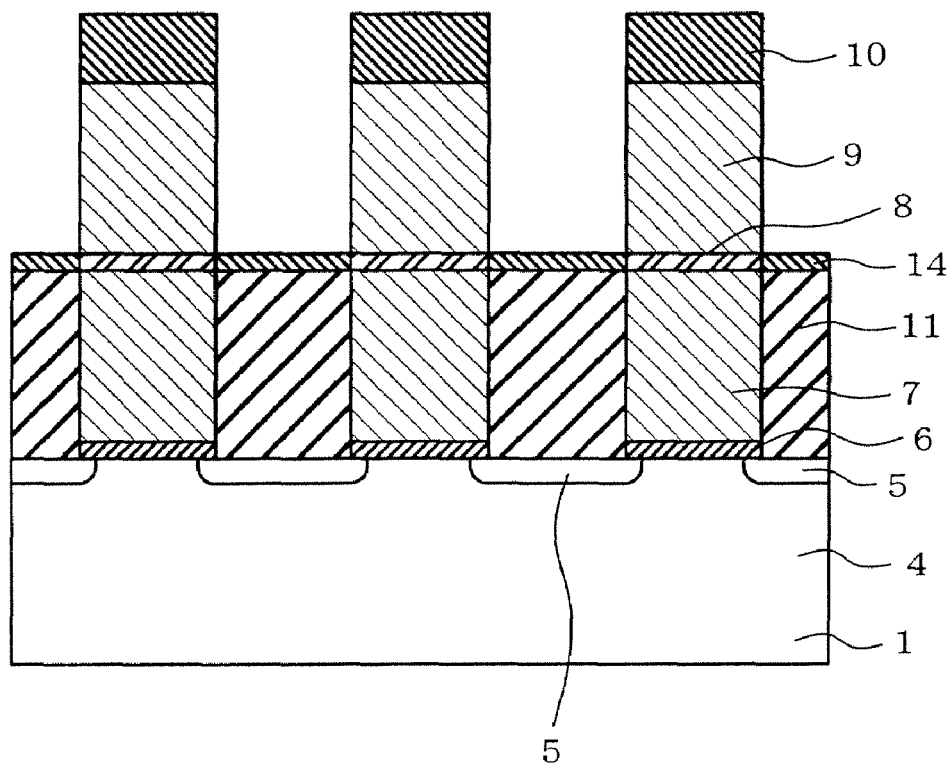
FIG. 11 is a schematic cross sectional view showing one phase of a manufacturing step ($2^{nd}$ variation).

FIGS. 9 to 11 illustrate a second embodiment of the present disclosure. The second embodiment differs from the first embodiment in that a silicon nitride film 14 constituting the nitride-based insulating film is formed only partially as compared to the first embodiment. FIG. 9 provides an overview of the features of the present embodiment. The silicon nitride film 14 is formed substantially in the same height as the inter-gate insulating film 8 so as to extend across the underlying structure in the portion between the gate electrodes MG as in the first embodiment. However, no silicon nitride film 14 is formed on the upper surface and the side surfaces of the control electrode film 9. Consequently, the silicon nitride film 14 in a strip-form is formed between the gate electrodes MG in the present embodiment.

According to the above described configuration, the silicon nitride film 14 is formed at greatest distance from the floating gate electrode film 7 and the control gate electrode film 9, in other words, it is formed in a vertical position substantially at level with the inter-gate insulating film 8. Thus, not only can the effects similar to the first embodiment be obtained, but also an improved suppressing of increase in parasitic capacitance between the gate electrode film 9 gaps can be obtained, since no silicon nitride film 14 is formed between the gate electrode films 9 unlike the first embodiment.

Next, a variation from the manufacturing steps of the first embodiment will be detailed hereinafter. The steps pursued in the first embodiment is carried out to obtain the state illustrated in FIG. 6, in which the gate electrode MG formation and filling of the silicon oxide film 11 constituting the first oxide-based insulating film between the gate electrode MG gaps are carried out. The silicon oxide film 11 is arranged in a thickness that is substantially at level with the upper surface of the floating gate electrode film 7.

Then, referring to FIG. 10, the silicon nitride film 14 containing boron that serves as the nitride-based insulating film is formed. Unlike the first embodiment, the silicon nitride film 14 is formed in the thickness to fill the gaps between the gate electrodes MG and to cover the upper surface of the gate electrode MG. The silicon nitride film 14 is formed in the temperature range of 400 to 600 degrees Celsius using source gases such as hexachlorodisilane ($Si_2Cl_6$) gas, ammonia ($NH_3$) gas, and trichloroboron ($BCl_3$) gas.

Next, referring to FIG. 11, the silicon nitride film 14 formed on the silicon oxide film 11 situated between the gate electrodes MG is etched to a thickness of about 10 to 30 nm by wet etch or dry etch. Thus, the silicon nitride film 14 remains in a strip-form only in the portion over the silicon oxide film 11 between the gate electrodes MG, and is completely etched away from the sidewalls of the control gate electrode film 9 and the upper surfaces of the gate electrode MG.

Thereafter, the silicon oxide film 13 constituting the second oxide-based insulating film is formed. As illustrated in FIG. 9, the silicon oxide film 13 constituting the second oxide-based insulating film is formed entirely over the upper surface of the silicon nitride film 14, the upper surface of the gate electrodes MG, and the sidewalls of the control gate electrode film 9. The silicon oxide film 13 is formed under the same conditions as the silicon oxide film 11. The gaps between the gate electrodes MG are thus filled by the silicon oxide film 13 which is also formed on the upper surface of the gate electrode MG.

The second embodiment leaving the silicon nitride film 14 in a strip-form only in the gaps between the gate electrodes MG achieves the same effects obtained in the first embodiment. Thus, the silicon nitride film 14 serves as a barrier film to prevent moisture permeation with increased capability of suppressing increase in parasitic capacitance.

The present disclosure is not limited to the above described embodiments but may be modified or expanded as follows.

Figure 8:
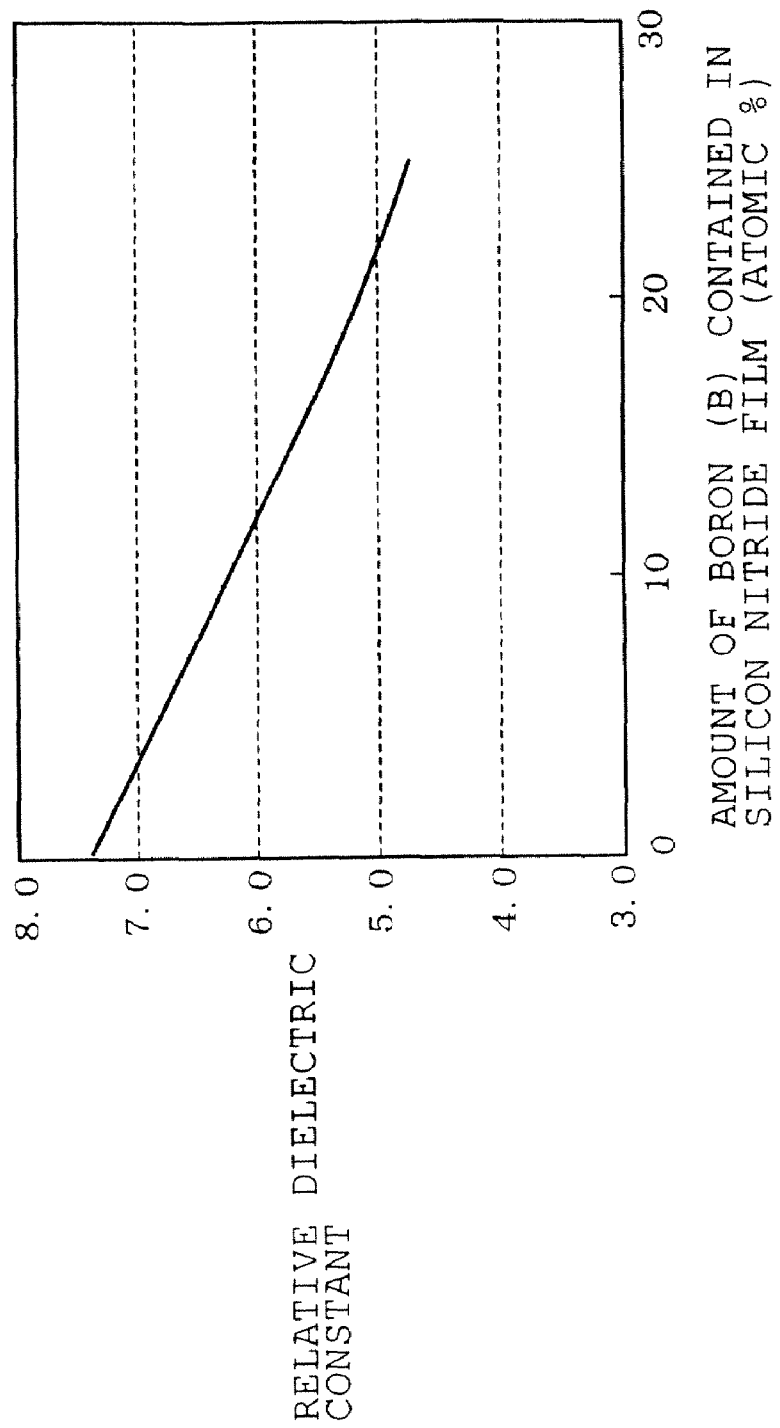
FIG. 8 is a graph indicating a correlation between amount of boron contained in a silicon nitride film and relative dielectric constant.

Adjustment may be made in the amount of boron contained in the silicon nitride films 12 and 14 to obtain the desired relative dielectric constant based on the correlation depicted in FIG. 8.

The silicon oxide films 11 and 13 may be composed of oxide films other than TEOS-based films.

The inter-gate insulating film may be composed of NONON (nitride-oxide-nitride-oxide) films other than ONO film.

The present disclosure may also be employed to NOR type flash memory.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A nonvolatile semiconductor memory device, comprising:
    a semiconductor substrate having an upper surface;
    a plurality of memory cell transistors formed in the semiconductor substrate, each memory cell transistor including a gate electrode having a gate insulating layer formed on the upper surface of the semiconductor substrate, a floating gate electrode layer formed on the gate insulating layer, an inter-gate insulating layer formed on the floating gate electrode layer, and a control gate electrode layer formed on the inter-gate insulating layer;
    a first oxide-based insulating film formed above the upper surface of the semiconductor substrate between the gate electrodes, the first oxide-based insulating film including an upper surface being at level with or higher than an upper surface of the floating gate electrode layer but lower than an upper surface of the control gate electrode layer;
    a nitride-based insulating film formed on the first oxide-based insulating film, the nitride-based insulating film containing boron (B) and located level with or higher than the upper surface of the floating gate electrode layer but lower than the upper surface of the control gate electrode layer; and
    a second oxide-based insulating film formed on the nitride-based insulating film.

2. The device of claim 1, wherein the nitride-based insulating film has a thickness equal to a thickness of the inter-gate insulating film.

3. The device of claim 1, wherein the first oxide-based insulating film directly contacts with the upper surface of the semiconductor substrate.

4. A method of manufacturing a nonvolatile semiconductor memory device, comprising:
    forming a plurality of gate electrodes on a semiconductor substrate, each gate electrode including a gate insulating layer formed on the semiconductor substrate, a floating gate electrode layer formed on the gate insulating layer, an inter-gate insulating layer formed on the floating gate electrode layer and a control gate electrode layer formed on the inter-gate insulating layer;
    forming a first oxide-based insulating film above the semiconductor substrate between the gate electrodes, the first oxide-based insulating film being formed at level with or higher than the floating gate electrode layer but lower than an upper surface of the control gate electrode layer;
    forming a nitride-based insulating film on the first oxide-based insulating film, the nitride-based insulating film containing boron (B);
    forming a silicide portion at an upper end portion of the control gate electrode layer after the nitride-based insulating film is formed on the first oxide-based insulating film; and forming a second oxide-based insulating film on the nitride-based insulating film and the silicide portion of the control gate electrode layer so as to cover the control gate electrode layer.

5. The method of claim 4, wherein the step of forming the nitride-based insulating film forms the nitride-based insulating film by using source gases including at least hexachlorodisilane ($Si_2Cl_6$) and boron (B).

6. The method of claim 4, wherein the nitride-based insulating film is also formed on a side surface of the control gate electrode layer.

7. The method of claim 4, wherein the step of forming the nitride-based insulating film forms the nitride-based insulating film in a thickness equal to a thickness of the inter-gate insulating film.

* * * * *